US011079436B2

(12) United States Patent
Schweitzer, III et al.

(10) Patent No.: US 11,079,436 B2
(45) Date of Patent: Aug. 3, 2021

(54) MULTIPLE MERGING UNIT TESTING SYSTEM

(71) Applicant: Schweitzer Engineering Laboratories, Inc., Pullman, WA (US)

(72) Inventors: Edmund O. Schweitzer, III, Pullman, WA (US); David E. Whitehead, Pullman, WA (US); Krishnanjan Gubba Ravikumar, Pullman, WA (US); Austin Edward Wade, Moscow, ID (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 0 days.

(21) Appl. No.: 16/919,891

(22) Filed: Jul. 2, 2020

(65) Prior Publication Data

US 2021/0109157 A1 Apr. 15, 2021

Related U.S. Application Data

(60) Provisional application No. 62/914,455, filed on Oct. 12, 2019.

(51) Int. Cl.
*G01R 31/327* (2006.01)
*G01R 35/02* (2006.01)

(52) U.S. Cl.
CPC ......... *G01R 31/3278* (2013.01); *G01R 35/02* (2013.01)

(58) Field of Classification Search
CPC .............................. G01R 31/3278; G01R 35/02
USPC ....................................................... 324/418
See application file for complete search history.

(56) References Cited

U.S. PATENT DOCUMENTS

| 4,524,446 | A | * | 6/1985 | Sun ...................... H02H 1/0084 324/123 R |
| 4,591,940 | A | * | 5/1986 | Sun ...................... H02H 1/0084 361/66 |
| 5,742,513 | A | * | 4/1998 | Bouhenguel ....... G01R 31/3278 324/418 |
| 6,396,279 | B1 | | 5/2002 | Gruenert |
| 6,608,493 | B2 | | 8/2003 | Hensler |
| 6,795,789 | B2 | | 9/2004 | Vandiver |
| 6,847,297 | B2 | | 1/2005 | Lavoie |
| 6,892,115 | B2 | | 5/2005 | Berkcan |
| 6,892,145 | B2 | | 5/2005 | Topka |
| 6,909,942 | B2 | | 6/2005 | Andarawis |
| 6,985,784 | B2 | | 1/2006 | Vandevanter |
| 6,999,291 | B2 | | 2/2006 | Andarawis |

(Continued)

OTHER PUBLICATIONS

PCT/US2020/052788 International Search Report and Written Opinion of the International Searching Authority dated Dec. 14, 2020.

(Continued)

*Primary Examiner* — Christopher P McAndrew
(74) *Attorney, Agent, or Firm* — Gregory C. Baker

(57) ABSTRACT

Systems and methods testing a power protection relay include a merging unit to receive signals from an electric power delivery system. The merging unit includes a test signal input to receive test signals from a testing device, a relay output to output at least one of the test signals to a power protection relay, a distribution output to output at least another of the test signals to one or more additional merging units, and a switch subsystem to route the test signal to the relay output or the distribution output.

20 Claims, 9 Drawing Sheets

(56) References Cited

U.S. PATENT DOCUMENTS

| | | |
|---|---|---|
| 7,012,421 B2 | 3/2006 | Lavoie |
| 7,043,340 B2 | 5/2006 | Papallo |
| 7,058,481 B2 | 6/2006 | Jiang |
| 7,058,482 B2 | 6/2006 | Fletcher |
| 7,068,483 B2 | 6/2006 | Papallo |
| 7,068,612 B2 | 6/2006 | Berkcan |
| 7,111,195 B2 | 9/2006 | Berkcan |
| 7,117,105 B2 | 10/2006 | Premerlani |
| 7,151,329 B2 | 12/2006 | Andarawis |
| 7,254,001 B2 | 8/2007 | Papallo |
| 7,259,565 B2 | 8/2007 | Diercks |
| 7,262,943 B2 | 8/2007 | Stellato |
| 7,301,738 B2 | 11/2007 | Pearlman |
| 7,460,590 B2 | 12/2008 | Lee |
| 7,532,955 B2 | 5/2009 | Dougherty |
| 7,636,616 B2 | 12/2009 | Fletcher |
| 7,693,607 B2 | 4/2010 | Kasztenny |
| 7,747,354 B2 | 6/2010 | Papallo |
| 7,747,356 B2 | 6/2010 | Andarawis |
| 7,986,503 B2 | 7/2011 | Papallo |
| 8,024,494 B2 | 10/2011 | Soed |
| 8,213,144 B2 | 7/2012 | Papallo |
| 8,560,255 B2 | 10/2013 | Elwarry |
| 8,891,963 B2 | 11/2014 | Patel |
| 9,366,711 B2 | 6/2016 | Klapper |
| 9,632,147 B2 | 4/2017 | Hensler |
| 9,819,611 B2 | 11/2017 | Snowdon |
| 10,178,047 B2 | 1/2019 | Chapman |
| 10,379,991 B2 | 8/2019 | Yang |
| 2003/0048508 A1 | 3/2003 | Yu |
| 2005/0104597 A1* | 5/2005 | Klijn ............... G01R 31/3278 324/418 |
| 2006/0268939 A1 | 11/2006 | Dries |
| 2008/0097712 A1 | 4/2008 | Bruce |
| 2008/0157775 A1* | 7/2008 | Finney ............. G01R 31/3277 324/418 |
| 2009/0012728 A1 | 1/2009 | Spanier |
| 2009/0296583 A1 | 12/2009 | Dolezilek |
| 2010/0040068 A1 | 2/2010 | Wimmer |
| 2010/0183298 A1 | 7/2010 | Biegert |
| 2012/0262008 A1 | 10/2012 | Becker |
| 2014/0074415 A1 | 3/2014 | Rudolph |
| 2014/0232415 A1 | 8/2014 | Ohtomo |
| 2016/0013632 A1 | 1/2016 | Lloyd |
| 2017/0026291 A1 | 1/2017 | Smith |
| 2017/0288950 A1 | 10/2017 | Manson |
| 2018/0034689 A1 | 2/2018 | Kanabar |
| 2018/0089057 A1 | 3/2018 | Yang |
| 2018/0348267 A1 | 12/2018 | Yang |

OTHER PUBLICATIONS

David Costello: Understanding and Analyzing Event Report Information, Oct. 2000.
Joe Perez: A Guide to Digital Fault Recording Event Analysis, 2010.
Considerations for Use of Disturbance Recorders; a Report to the System Protection Subcommittee of the Power System Relaying Committee of the IEEE Power Engineering Society, Dec. 27, 2006.
David Costello: Event Analysis Tutorial, Part 1: Problem Statements 2011.
Jane Starck, Antti Hakala-Ranta, Martin Stefanka, Switchgear Optimization Using IEC 61850-9-2 and Non-Conventional Measurements May 23, 2012.
Will Allen, Tony Lee: Flexible High-Speed Load Shedding Using a Crosspoint Switch Oct. 2005.
Qiaoyin Yang, Rhett Smith: Improve Protection Communications Network Reliability Throught Software-Defined Process Bus, Jan. 2018.
Caitlin Martin, Steven Chase, Thanh-Xuan Nguyen, Dereje Jada Hawaz, Jeff Pope, Casper Labuschagne: Bus Protection Considerations for Various Bus Types; Oct. 2013.

\* cited by examiner

MULTIPLE MERGING UNIT TESTING SYSTEM

RELATED APPLICATION

This application claims the benefit of the filing date of U.S. Provisional Patent Application Ser. No. 62/914,455, filed Oct. 12, 2019, for "Multiple Merging Unit Testing System," the disclosure of which is hereby incorporated herein in its entirety by this reference.

TECHNICAL FIELD

This disclosure relates to a system for testing a primary protection device of an electric power delivery system. More particularly, this disclosure relates to merging units for selectively applying test signals to a protection relay under test to simulate disparate power system equipment and conditions.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Figure 1:
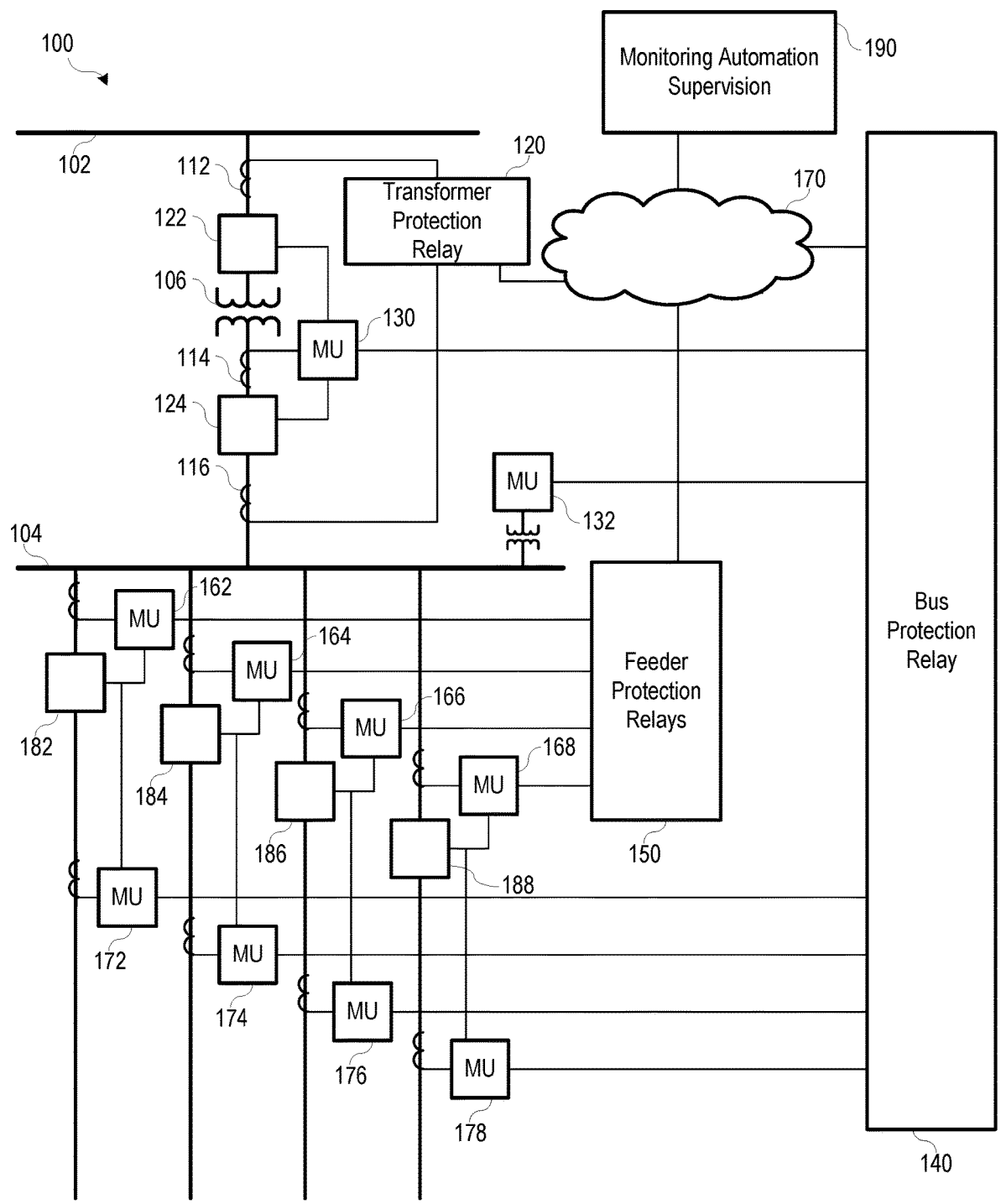
FIG. 1 illustrates a simplified one-line diagram of an electric power delivery system for providing electric power to loads including a system of traditional intelligent electronic devices (IEDs) and relays for protection and automation.

Electric power delivery systems are widely used to generate, transmit, and distribute electric power to loads, and serve as an important part of the critical infrastructure. Power systems and components are often monitored and protected by intelligent electronic devices (IEDs) and systems of IEDs that obtain electric power system information from the equipment and provide protective actions, monitor, and automate the power system. Several IEDs may be in communication to facilitate sharing of information for station-wide, area-wide, or even system-wide protection.

Modern electric power protection systems are integrated with automation, monitoring, and supervisory systems that rely on digital communication. IEDs perform numerous protection, automation, monitoring, and metering tasks that require proper settings and communications between IEDs and among IEDs and other devices. Such systems of IEDs are highly engineered for the proper functioning of the devices individually and the system as a whole. To ensure proper configuration, devices may be tested at the time of setting and commissioning, and thereafter as needed in accordance with a testing and maintenance schedule, as well as when devices or equipment are replaced or updated, and when new devices or equipment are added to the system. Testing of IEDs and systems of IEDs may require a significant amount of time and testing equipment and may require taking portions of the electric power delivery system and the system of IEDs out of service during the testing procedure.

In a test configuration, a test set may create and inject signals that are representative of conditions that may occur in an electric power delivery system. In response to such signals, the protective relay under test may implement various actions (e.g., opening a breaker, stepping up a voltage, connecting a capacitor bank, etc). Proper function on the protective relay in response to tests may confirm that the relay will operate as expected when such conditions occur in the electric power system and ensure that the configuration of the relay is correct. Further, such testing may verify the wiring and operation of various elements (e.g., relay analog-to-digital (A/D) converters, etc.).

As will be discussed in more detail herein, one complication that may arise in the context of testing is the physical distance between devices under test. Devices that utilize rely on the same inputs may be spread across a substation yard or building. This separation may make testing setpoints from various protection tests difficult, requiring multiple test sets at various locations, and time synchronization of the various test sets.

Embodiments of the present disclosure include improved systems for testing electric power protection systems using test signals at a single location or from a single device. For example, embodiments of the present disclosure may inject test signals into a single merging unit, with digital secondary signals being communicated to multiple merging units of the system under test. In some embodiments, existing communication links between merging units in the electric power protection systems to distribute the test signals. Thus, electric power delivery protection systems may be set, commissioned, and tested in relatively less time and with fewer resources.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified. In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described may be implemented as software modules or components. As used herein, a software module or component may include any type of computer instruction or computer-executable code located within a memory device and/or transmitted as electronic signals over a system bus or wired or wireless network. In addition, data being tied or rendered together in a database record may be resident in the same memory device, or across several memory devices, and may be linked together in fields of a record in a database across a network. Embodiments may be provided as a computer program product including a non-transitory computer and/or machine-readable medium having stored thereon instructions that may be used to program a computer (or other electronic device) to perform processes described herein.

FIG. 1 illustrates a simplified one-line diagram of an electric power delivery system 100. It should be noted that the system 100 may include multiple phases and additional equipment and complexity. Also illustrated is a system of IEDs that obtain electric power system information from merging units (MUs), and effect control actions on the electric power system. The power system includes various equipment such as a bus 102 (illustrated as a transmission bus) providing electric power to a second bus 104 (illustrated as a distribution bus) via a transformer 106 for stepping down the power from a high (transmission) voltage to a lower (distribution) voltage. Various feeders extend from the second bus 104 for delivering electric power to distributed loads. Circuit breakers 122, 124, 182, 184, 186, 188 may be used to selectively connect and disconnect portions of the power system for various purposes such as reconfiguration, protection in the event of a fault, or the like.

A bus protection relay 140 may be an IED configured to determine operating conditions on a zone that includes the second bus 104 and provide signals to effect a protection operation upon determination of an adverse condition. IED 140 may obtain current signals related to electric power entering the bus 104 from MU 130, voltages from bus 104 using MU 132, and current signals related to electric power leaving bus 104 on the feeders from MUs 172, 174, 176, and 178. IED 140 may be configured to provide differential protection, overvoltage protection, and various other protection for zone including the bus 104.

A feeder protection relay may be an IED 150 that obtains bus voltage signals from MU 132 and current signals related to the feeders from MUs 162, 164, 166, and 168. IED 150 may provide overcurrent, directional, distance, overfrequency, underfrequency, and other protection to the feeders. Feeder protection relays (IED 150) may communicate with bus protection relay 140 via network 170.

A transformer relay may be an IED 120 configured to provide protection to the transformer 106. IED 120 may obtain current signals from both sides of the transformer 106 from MUs or even directly from current transformers (CTs) 112 and 116. IED 120 may further provide information to IED 140 (e.g. via communications network 170). IED 120 may be configured to provide differential protection overcurrent protection, over frequency protection, underfrequency protection, and other various protection for the transformer 106.

MUs may be in communication with various circuit breakers 122, 124, 182, 184, 186, and 188 to provide signals to the circuit breakers and receive status information from the circuit breakers. Upon receiving an "open" signal from an IED, the MUs may be configured to signal-related circuit breakers to open. For example, upon detection of an overcurrent condition on the first feeder, IED 150 may be configured to signal MU 162 to open breaker 182 to remove current from the faulted feeder.

In various embodiments, the IEDs may be in communication with a monitoring, automation, or other supervisory system or device 190, such as a SCADA system. Such communications may be facilitated over communications network 170. Communications architecture as illustrated are highly engineered, and present multiple possible points of failure and attack. As mentioned above, a failure in communications or a cyber-attack on the system may affect the bus protection relay 140, feeder protection relay 150, or transformer relay 120 resulting in disruption of the protection of the power system.

Figure 2:
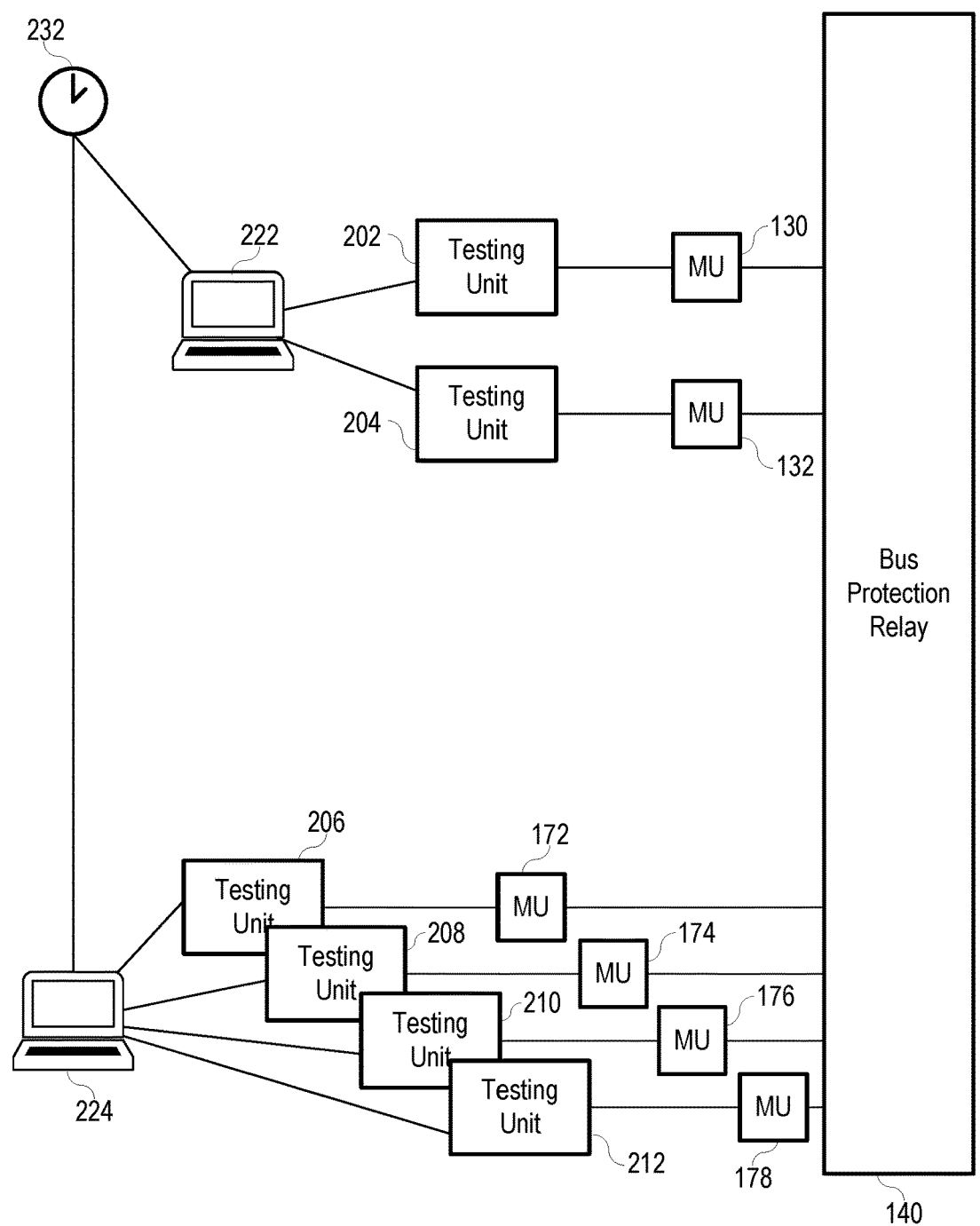
FIG. 2 illustrates a simplified block diagram for testing a bus protection relay in the electric power delivery system of FIG. 1.

FIG. 2 illustrates a simplified block diagram of a system for testing a device, such as the bus protection relay 140 of FIG. 1. The bus protection relay 140, may utilize current and/or voltage signals to perform differential protection and other operations within a zone of protection. In order to test the operations of the bus protection relay 140, known signals are injected into the merging units 130, 132, and 172-178, and the response from the bus protection relay 140 is monitored. In particular, the testing system includes a number of testing units 202, 204, 206, 208, 210, 212 configured to provide electrical signals to the merging units 130, 132, 172, 174, 176, 178; which in turn provide digitized analog signals corresponding with those electrical signals to the bus protection relay 140. Command outputs from the bus protection relay 140 are made to particular of the merging units, which in turn signal the corresponding testing unit.

Merging units are often located in the vicinity of the primary equipment, whereas the bus protection relay 140 is typically located in a control house. Further, primary equipment monitored by the bus protection relay 140 are often located some distance from each other, even on the order of thousands of feet. Accordingly, to inject signals into the subject merging units, either very long cables from a single testing unit, or, as illustrated, multiple testing units 202-212 located proximate to the subject merging units 130, 132, and 172-178 are generally used. The testing units 202-212 may be controlled by one or more controllers 222, 224. With the distance between the testing units, multiple controllers 222, 224 may be used. Time-coordination of the injected signals may be used for proper testing of the protection functions of the bus protection relay 140. For the injected signals to be time coordinated, the controllers may receive a common time signal from a common time source 232.

As can be seen, for proper differential testing of a bus protection relay 140, several testing units, multiple controllers, and a common time source are needed. To perform the test, several merging units may be disconnected from the power system and connected to the testing units. With the number of devices and connections required for testing as illustrated, there is an increased likelihood of error. Embodiments of the present disclosure include an improved system for protecting an electric power delivery system, and a testing system that requires less equipment and time.

Figure 3:
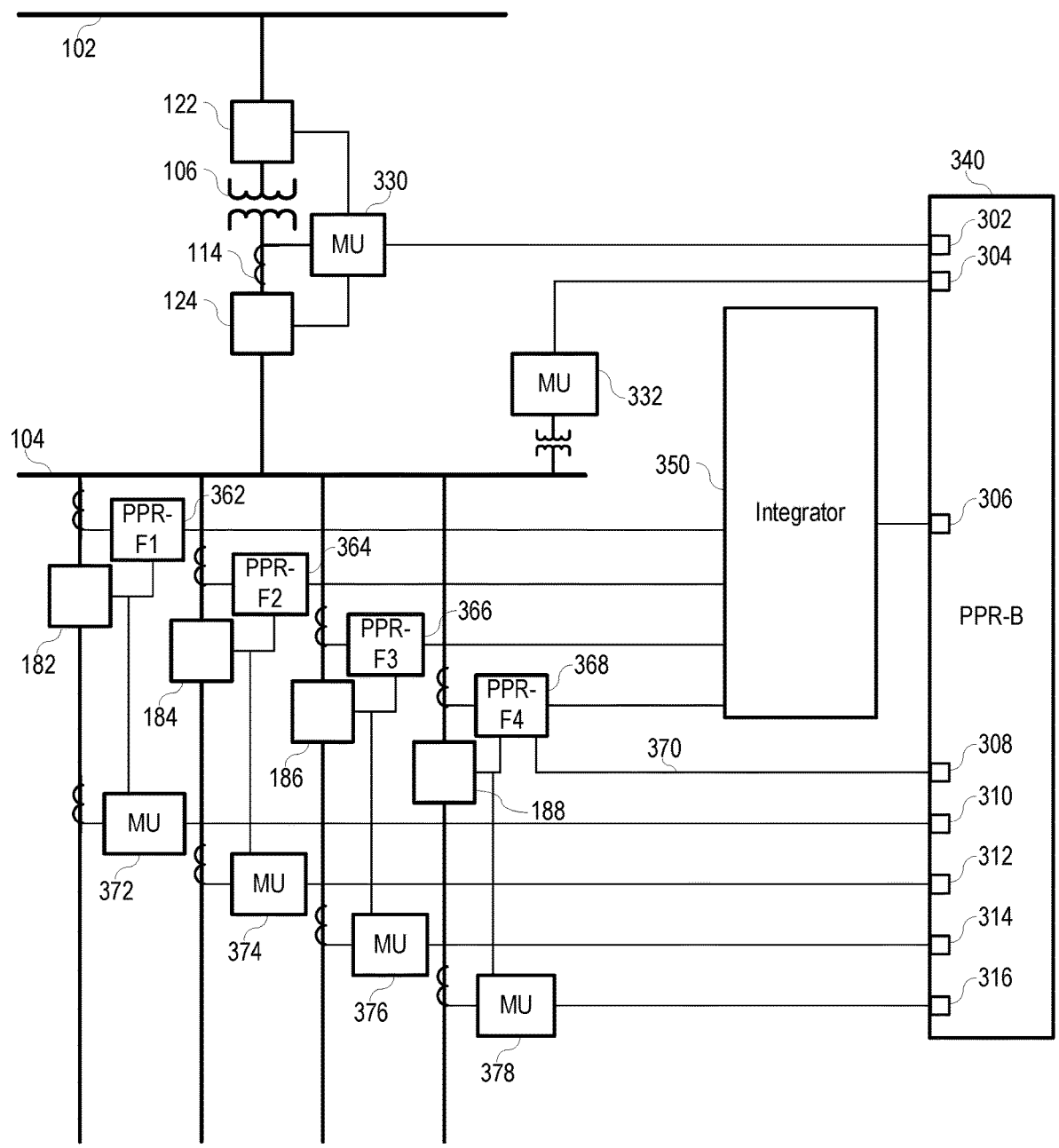
FIG. 3 illustrates a simplified one-line diagram of an electric power delivery system for providing electric power to loads including protection relays and an integration system in accordance with embodiments of the disclosure.

FIG. 3 illustrates a simplified one-line diagram of an electric power delivery system that may be similar to the system illustrated in FIG. 1, including a protection system in accordance with the present disclosure. In particular, the protection system includes various primary protection relays: primary transformer protection relay PPR-T 320, primary bus protection relay 340 (e.g., PPR-B), primary feeder protection relays PPR-F1 362, PPR-F2 364, PPR-F3 366, and PPR-F4 368, that do not depend on communication with automation, monitoring, or supervisory systems to continue providing critical protection to the electric power delivery system equipment. Such primary protection relays may be used to separate primary protection functions from other functions traditionally performed by IEDs. Communications among primary protection relays may be facilitated by an integrator 350. Integrator 350 may act as a supervisory system that coordinates operations among a plurality of primary protective relays and other devices.

Feeders from bus 104 may be protected using feeder relays PPR-F1 362, PPR-F2 364, PPR-F3 366, and PPR-F4 368. Feeder relays 362-368 may obtain current signals from respective feeders using CTs and/or merging units such as MUs 372, 374, 376, 378. Feeder relays 362-368 may further obtain voltage signals from the bus using a potential transformer (PT) and/or a merging unit such as MU 332. Using the current and/or voltage signals, the feeder relays 362-368 may determine operating conditions on the respective feeders including, for example: phase overcurrent; ground overcurrent; neutral overcurrent; negative sequence overcurrent; arc flash; overvoltage, undervoltage; directional power; overfrequency; underfrequency; rate-of-change-of-frequency; fault direction; fault distance; and the like. In the event of a condition determined outside of predetermined operating conditions, the feeder relay 362-368 may be configured to send an open or trip command to an associated circuit breaker, thus effecting a protective action on the electric power delivery system.

Feeder relays 362-368 may be in communication with respective circuit breakers 182, 184, 186, 188 as illustrated. In various embodiments, the feeder relays 362-368 may be in direct communication with the circuit breakers 182-188 as illustrated. In various other embodiments, the feeder relays 362-368 may be in communication with the circuit breakers 182-188 via merging units such as MUs 372-378. Accordingly, feeder relays 362-368 may provide protection to the feeders using measurements from the power system, using the measurements in one or more protective elements, and effecting a protective action by commanding a circuit breaker to open.

The protection system may include an integrator 350 in communication with various devices and equipment in the electric power delivery system. The integrator 350 may perform monitoring, automation, supervisory, communication, secondary (non-critical, backup, or the like) protection, and other functions. As illustrated, the primary protection relays (such as, for example, the transformer relay 320 and the feeder relays 362-368) may be in communication with the integrator 350. According to various embodiments, the primary protection relays may transmit sample values, states, and commands to the integrator 350 useful for its monitoring, automation, backup, supervisory, and other functions, and for communication to other primary protection relays.

The primary protection relays may transmit such communications in accordance with a predetermined communication protocol. In various embodiments, the protocol includes an identification of the primary protection relay that is sending the communication, and a payload of the predetermined set of signal values, states, and commands. The payload may vary depending on the type of primary protection relay (feeder protection relay, transformer protection relay, bus protection relay, or the like). A user may apply settings to the primary protection relay governing which signal values, states, and commands are transmitted. Primary protection relays may be configured to transmit such communications in accordance with a predetermined schedule. Primary protection relays may continuously send such communications regardless of a change in state or command.

As mentioned above, each primary protection relay may perform protection functions for the equipment monitored thereby with or without communications with the integrator 350, other primary protection relays, or IEDs. For example, the transformer relay PPR-T 320 may perform overcurrent protection, overvoltage protection, undervoltage protection, and differential protection for the transformer 106 using signals obtained from the equipment regardless of communication with the integrator 350 or other devices. Further automation, control, and protection functions may be performed using signals from other primary protection relays or supervisory systems received by transformer relay 320 via the integrator 350. For example, in the case of a breaker failure on one of the feeders, the responsible primary protection relay of the feeder may provide a breaker failure signal to the integrator 350. The integrator 350 may be configured to send breaker failure signals to the bus protection relay 340. Upon receipt of the breaker failure signal, the bus protection relay 340 may signal MU 330 to open breaker 124 and/or breaker 122, to deenergize the faulted feeder.

The protection system may also include a primary protection relay in the form of a bus protection relay 340 configured to provide protective functions to the bus 104. Bus protection relay 340 may be a primary protection relay, as it is capable of obtaining power system measurements and providing protective functions without communication with any monitoring or other supervisory system. Bus protection relay 340 may obtain electric power system measurements related to electric power entering and leaving the protected bus 104 using CTs, PTs and the like and/or merging units. For example, protection relay 340 may include a number of communication ports 302, 304, 306, 308, 310, 312, 314, 316 for receiving power system signals from various other protection devices and/or merging units. The communication ports 302-316 may facilitate communications on optical media, electrical media, or the like. The communication ports 302-316 may facilitate one-way or bi-directional communication. Current measurements on one side of the bus 104 from merging unit 330, which obtains current signals using CT 114, may be provided to the protection relay 340 via communication port 302.

As illustrated, bus protection relay 340 obtains current measurement on one side of the bus 104 from merging unit 330, which obtains current signals using CT 114. Voltage measurements may be obtained from merging unit 332, which obtains voltage signals from the bus 104 using a PT. Measurements of current on the other side of the bus 104 may be obtained from merging units 372, 374, 376, 378, which obtain current signals from the feeders using CTs. The bus protection relay 340 may use the currents and/or voltages to perform various protection functions such as, for example: overcurrent (phase, ground, neutral); breaker failure; time-overcurrent; current differential; undervoltage; overvoltage; and the like. The bus protection relay 340 may protect a zone of the electric power delivery system such as, for example, the zone between circuit breaker 124 and breakers 182-188. The bus protection relay 340 may be configured to detect an event using the currents and/or voltages, and send a trip command to one or more circuit breakers to remove power from a portion of the power system affected by the event. For example, the bus protection relay 340 may determine that a fault is present on bus 104 using current differential protection principles, and command breaker 124 to open (either via direct communication or via merging unit 330) to remove electric power from the faulted bus 104. The bus protection relay 340 may further command breakers 182-188 to open (either via direct communication or via merging units 372-378) to limit potential backfeed from the feeders into the faulted bus 104.

Similar to the primary protection relays 320 and 362-368, the bus relay may continue providing protective functions to the power system regardless of availability of any integrator, monitoring, automation, or supervisory systems or devices. In various embodiments described herein, the primary protection relays 320, 340, 362-368 may primarily perform protective functions, with secondary functions being removed to a separate device, such as the integrator 350. For example, calculating, time stamping, and time aligning synchrophasors may be unnecessary for protective functions, and thus removed to the integrator. Similarly, many communications functions such as formatting communications to correspond with supervisory protocols may be removed to the integrator.

Some primary protection functions may be performed by a combination of primary protection relays. For this, the system may include some communication between primary protection relays. As illustrated, a dedicated communication pathway 370 is configured between feeder relay 368 and bus relay 340. Although a single communication pathway between one feeder relay and the bus relay is illustrated, several primary protection relays may be in similar communication. The communication may be peer-to-peer, high speed, and operate on optical or electrical media. The communication may operate in accordance with the MirroredBits® protocol available from Schweitzer Engineering Laboratories, Inc. of Pullman, Wash. In certain embodiments, the communication may facilitate primary protection functions such as, for example, transfer trip, blocking, interlocking, permissive schemes, direct control, relay-to-relay communications, or the like. In the illustrated example, the communication 370 may be useful for direct transfer tripping by the bus relay 340 in the event of breaker failure detection by the feeder relay 368. Thus, the bus relay may clear a fault by opening breaker 124 and/or 122 in the event that breaker 188 does not trip.

The integrator 350 may communicate monitoring, automation, and supervisory information to the primary protection relays, and to facilitate communications among the primary protection relays. For example, the integrator 350 may perform breaker failure analysis to determine if a breaker has operated after a signal has been sent to open the breaker. If the integrator 350 determines that the breaker has not opened, it may send a signal to the merging unit and/or to the appropriate primary protection relay to attempt to open the breaker. The integrator 350 may also signal a second breaker to open, where the second breaker is positioned to also remove power from the effected portion of the electric power delivery system. For example, upon failure of breaker 182, the integrator 350 may signal for breaker 122 or 124 to open, removing power from the bus 104 and related feeders.

The integrator 350 may further be configured to send specified communications from certain primary protection relays to appropriate receiving primary protection relays. For example, bus 104 voltage measurements from the primary bus protection relay 340 may be useful for certain protection operations of the feeder protection relays 362-368. Accordingly, the integrator 350 may be configured to send bus voltage measurements from protection relay 340 to each of the feeder protection relays 362-368 by routing such voltage measurements to the communications ports associated with each of the feeder protection relays 362-368.

Communications between the primary protection relays and the integrator may be bi-directional. In various embodiments, the integrator 350 may include multiple communications ports, each associated with a different primary protection relay. Each communications channel may be synchronous or asynchronous. Each communications channel may be deterministic such that communications among primary protection devices is deterministic. With different communication ports in communication with different primary protection relays, the integrator 350 may be easily configured to route specific communications among different primary protection relays by simply routing the communications between different communication ports.

Communications between the various merging units and primary protection relays may be bi-directional. For example, the merging units may send signals related to electric power system measurements and equipment status using a predetermined protocol. Primary protection relays may send commands to the connected merging units (such as open, close, step up, step down, and the like) using the predetermined protocol. The merging units signal primary equipment in accordance with the received commands.

Figure 4:
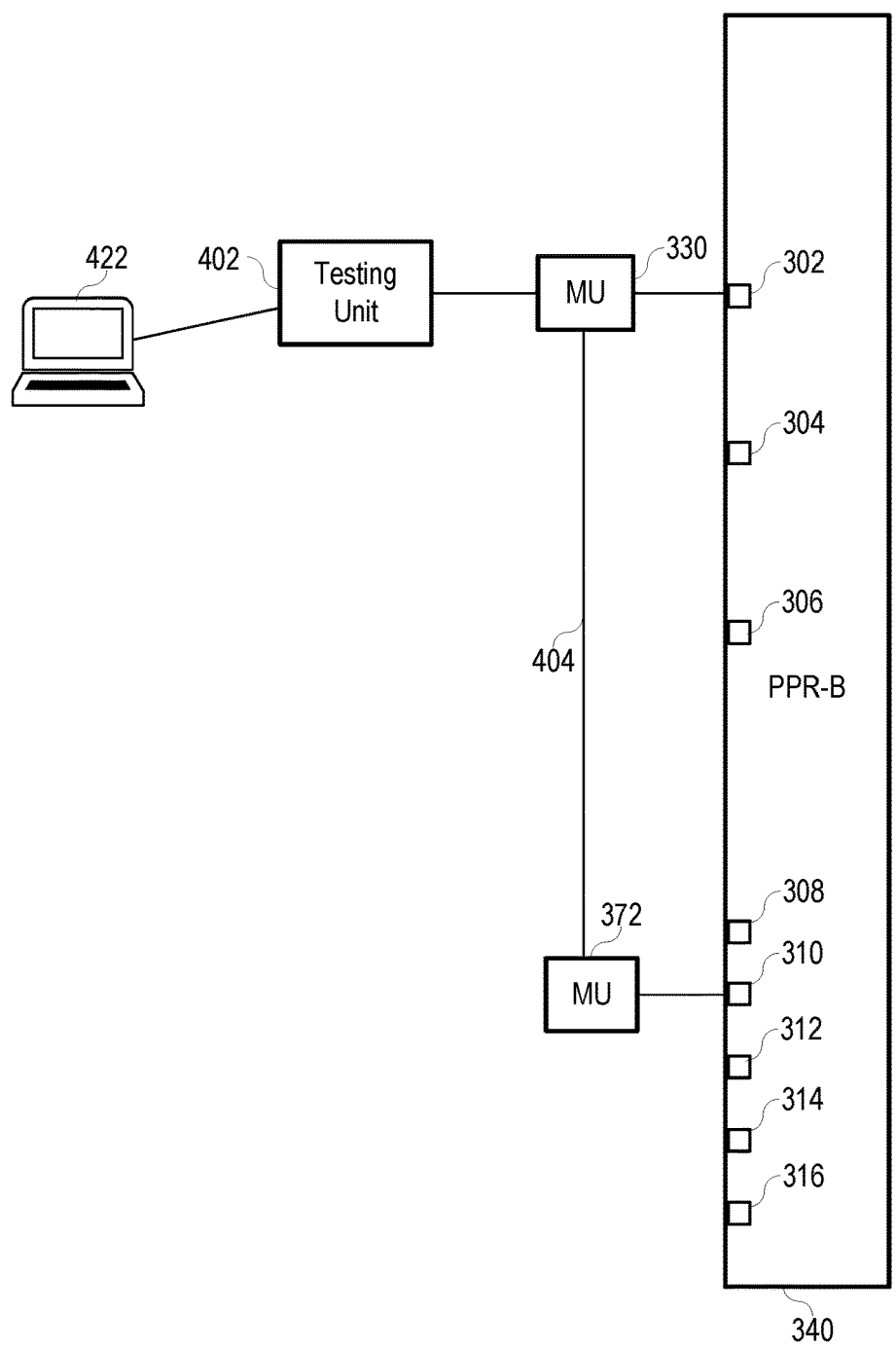
FIG. 4 illustrates a block diagram of a system for commissioning and/or testing the protection relay of FIG. 3.

FIG. 4 illustrates a testing device 402 and a system for testing a bus protection relay 340 in accordance with embodiments of the disclosure. Instead of providing signals to multiple merging units, the testing device 402 of the present disclosure provides signals directly to one merging unit 330. The testing device 402 may provide signals to the merging unit 330 in accordance with the predetermined protocol. The first or initial merging unit 330 may be used to process and forward the test signals to additional merging units 332, 372-378 (illustrated in FIG. 3) that are in communication with and downstream from the first merging unit 330.

Use of the testing device 402 may simplify testing of a protective device, such as the relay 340, as a single testing device 402 may be used to test multiple merging units 332, 372-378 in series to provide test signals to the bus protection relay 340. For example, testing signals from the testing device 402 (e.g., with an associated controller 422) may transmit test signals to the first merging unit 330. The first merging unit 330 may pass the signals to the protection relay 340, to an additional, downstream merging unit 372, or to a combination of the protection relay 340 and the merging unit 372. Where the testing signals are provided from the first merging unit 330 to the additional merging unit 372, the additional merging unit 372 may then pass the signals to the protection relay 340 so that test signals from both the first merging unit 330 and the additional merging unit 372 may be received at the protection relay 340.

In such embodiments, rather than requiring multiple testing devices, one or more of the merging units 330, 372 may be selectively configured to supply at least a portion of the signals from the testing device 402 to both the protection relay 340 and to additional merging units. For example, merging unit 330 may supply at least some of the signals from the testing device 402 to downstream merging unit 372. In some embodiments, communication between merging unit 330 and 372 may be conducted using an existing communication link 404 (e.g., a communication link that is used in typical operation and not only while the system is under test). In other embodiments, communication between MU 330 and MU 372 may be routed through protection relay 340. In additional embodiments, communication lines may be provided between merging unit 330 and 372 specifically for testing procedures as disclosed.

Testing unit 402 may generate a plurality of test signals. The plurality of test signals may include a first subset that is directed by merging unit 330 to bus protection relay 340 and a second subset that is directed by merging unit 300 to MU 372. MU 372 may direct the second subset of the plurality of test signals to bus protection relay 340.

Figure 5:
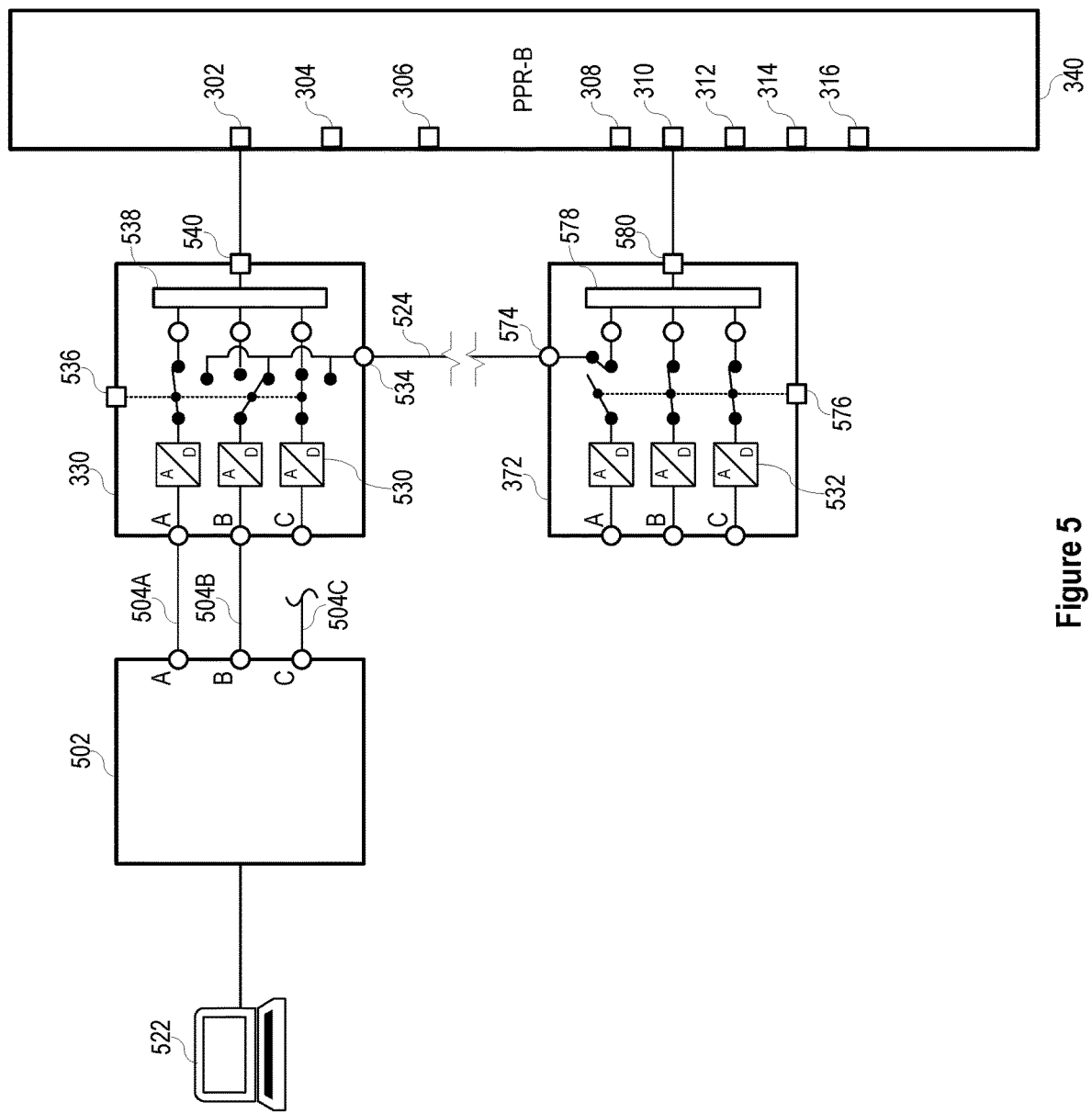
FIG. 5 illustrates a block diagram of a system for testing a protection relay in accordance with embodiments of the disclosure.

FIG. 5 illustrates a functional block diagram of a system for protection of an electric power delivery system. As shown in FIG. 5, the testing device 502 may include three phase outputs A, B, C for connection with merging unit 330 (e.g., corresponding inputs A, B, C on the merging unit 330), all or some of which outputs A, B, C may be in communication with the merging unit 330. In some embodiments, the testing device 502 may be controlled by a testing controller 522. Instead of requiring two or more testing devices, the merging units 330, 372 in accordance with embodiments herein may be switched into testing mode and distribute testing signals 504 among the merging units 330, 372 (e.g., testing signals generated from the testing device 502 that is directly connected to only one merging unit 330).

Testing device 502 may provide communication paths for the testing signals 504. For example, the testing device 502 may provide an A-phase current via signal 504A, a B-phase current via signal 504B, and, in some embodiments, a C-phase current via signal 504C. The testing device 502 may include one or more signal processors to modify the signals 504 (e.g., analog-to-digital (A/D) converters 530 on each of the communication paths for the testing signals 504). For example, the A/D converters 530 may convert current and/or voltage signals 504 from the testing device 502 from analog signals to digital signals. In some embodiments, the merging unit 330 may create data packets of digital information with the converted digital signals with time-domain link (TiDL) technology for transferring between components of the system.

As depicted, the merging unit 330, when in testing mode, provides an A-phase current signal 504A to the protection relay 340, and also sends the digitized B-phase current signal 504B to merging unit 372. For example, switch 536 (e.g., a logic switch, a physical switch) may pass signal 504A as normal to optionally be combined with other signals 504 and output to the protection relay 340 (e.g., by combining packets of the signal 504A at distribution point or node 538 and sending the packets to a relay output 540 of the merging unit 330). The switch 536 may reroute or bypass the test signal 504B from its normal output destination of the protection relay 340 to another output (e.g., distribution output 534). A connection 524 between the merging unit 330 and another merging unit 372 (e.g., a fiber optic connection, an ethernet connection, etc.) may provide the test signal 504B to an input 574 of the downstream merging unit 372. In some embodiments, the test signal 504B may bypass the A/D converters 532 of the merging unit 372.

The signal 504B inputted into merging unit 372 may now be provided as an A-phase signal to protection relay 340. For example, switch 576 may bypass the normal route of an A-phase signal into the merging unit 372 and, instead, connect the input 574 to the protection relay 340 (e.g., by sending packets of the signal 504B through a distribution point or node 578 and to a relay output 580 of the merging unit 372). As discussed below, the switch 576 may enable the merging unit 372 to direct an incoming test signal 504 (e.g., from the first merging unit 330) to any communication line corresponding to one of the signal inputs A, B, C on the merging unit 372 for output to the protection relay 340 as one respective A-phase, B-phase, or C-phase signal outputs.

In some embodiments, the testing device 502 and/or test controller 522 may output various phase current signals 504 to be representative of a single phase (e.g., A-Phase) at two different locations (e.g., from two different merging units 330, 372) with independent current injections such that users may test differential setpoints, setpoint slope, external faults, or other protection schemes of the protection relay 340, which may require such multiple independent current injections.

In some embodiments, one or more of the merging units 330, 372 and/or the protection relay 340 may indicate to a user when the merging units 330, 372 have been placed in a test position (e.g., where one or more of phase inputs are placed in the bypass selection to send the test signals to another merging unit rather than the protection relay).

As discussed above, with an increase of digital secondary protection in substations, bus differential relays may not have secondary current inputs that are physically located near each other. Instead they may be spread across a substation yard or building. This makes testing setpoints for some protection tests very difficult, requiring multiple test sets that are synched with GPS.

Such methods of testing distributed relays, according to embodiments of the disclosure, may implement a user-selectable switch on time-domain link (TiDL) merging units and a fiber optic test port. As also discussed above, traditional three-phase secondary current test set may be connected to one merging unit. The user may select test output based on the phase input in which the signal or current is input. As depicted, the testing device 502 is connected to B-phase locally, and has selected the test output to make local B-phase pass to the second merging unit 372 in order to transmit A-phase to the protection relay 340. The first merging unit 330 may be connected to the second merging unit 337 via fiber optic connection or cable. The test input in the first merging unit 330 receives only A-phase data, which is then transmitted to the protection relay 340 in the control house. If any merging unit is in test mode, one or more of the merging units 330, 337 will indicate such a testing mode in the control house. As depicted, the merging units 330, 337, with independent current injections, may test differential setpoints or any other protection schemes requiring multiple independent current injections.

Figure 6:
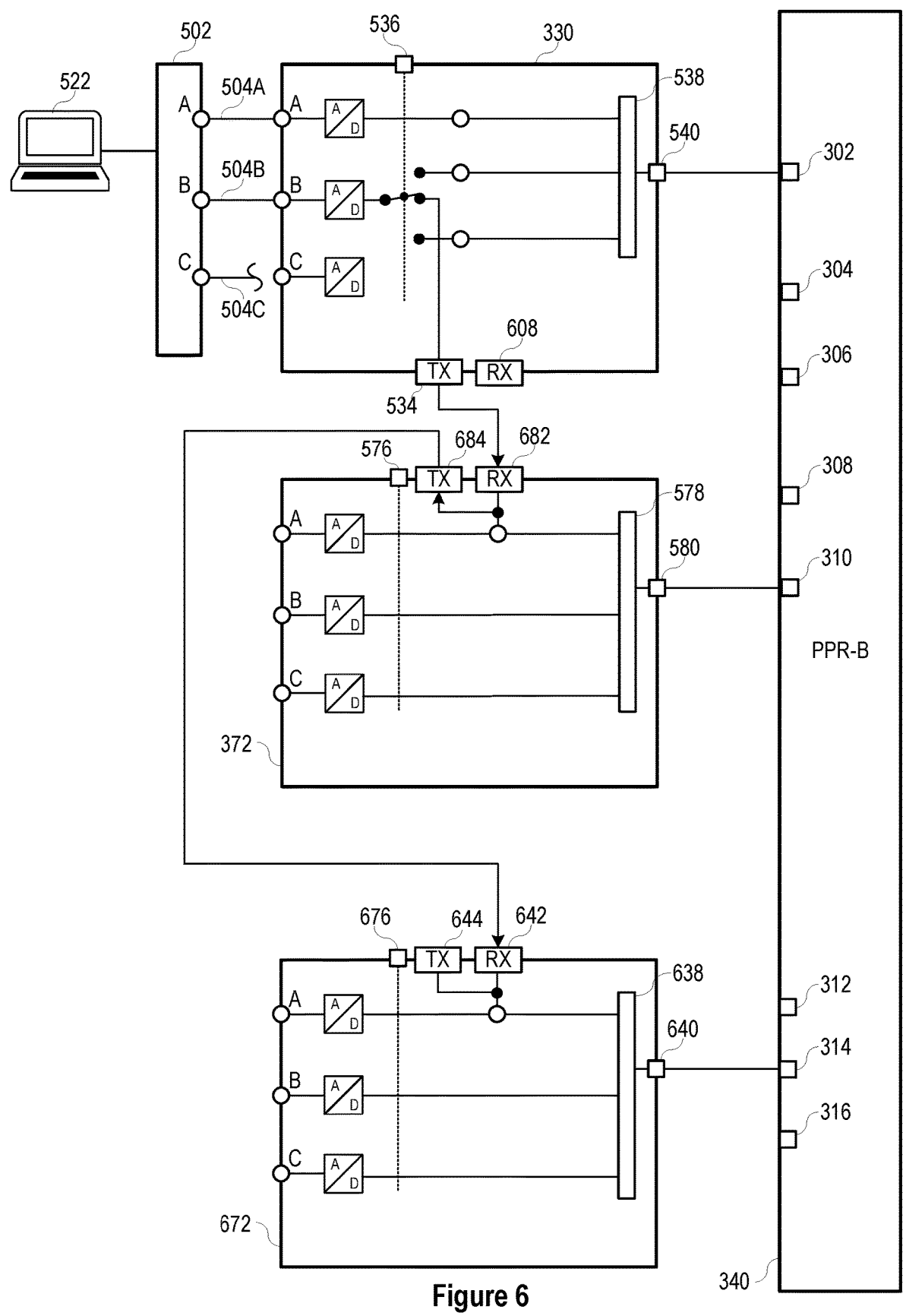
FIG. 6 illustrates a simplified block diagram of merging units in a system for testing a protection relay in accordance with embodiments of the disclosure.

FIG. 6 depicts how multiple merging units may be daisy-chained together, for testing more complex protection schemes in accordance with some embodiments of the disclosure. The test signals 504 may be routed through and between the merging units 330, 372, and an additional merging unit 672 in a manner similar to that discussed above, where some duplicative elements are omitted from FIG. 6.

As depicted, each merging unit 330, 372, 672 may include respective inputs and outputs for routing the test signals 504 between the merging units 330, 372, 672. For example, merging unit 330 may include output 534 and input 608, merging unit 372 may include output 684 and input 574, and merging unit 672 may include output 644 and input 642.

In a manner similar to that discussed above, signal 504B may be inputted into merging unit 372 be provided as an A-phase signal to protection relay 340 and/or may be rerouted by the merging unit 372. For example, the merging unit 372 may transmit the signal 504B to the third merging unit 672 (e.g., via output 684 of the second merging unit 372 and input 642 of the third merging unit 672). Switch 676 may bypass the normal route of an A-phase signal into the merging unit 672 and, instead, connect the input 642 to the protection relay 340 (e.g., by optionally combining packets of the signal 504B at distribution point or node 638 and passing the packets to a relay output 640 of the merging unit 672).

Figure 7:
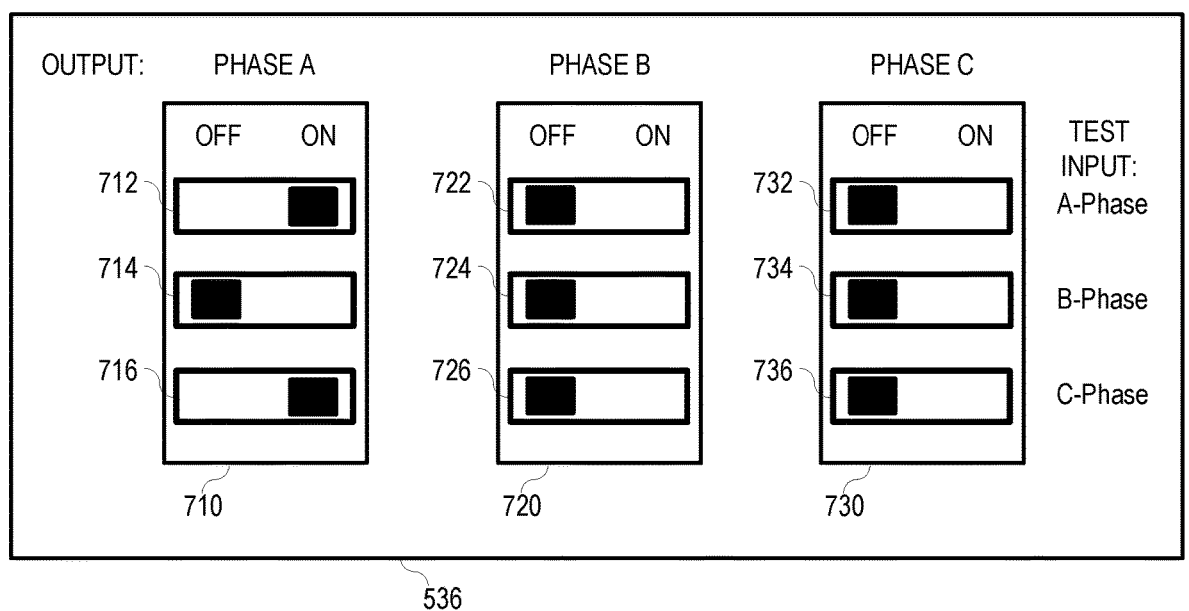
FIG. 7 illustrates an interface for selecting between inputs and outputs of a merging unit in a system for testing a protection relay in accordance with embodiments of the disclosure.

FIG. 7 illustrates an interface comprising series of output selection switches 536 for merging units to control which inputs are correlated with outputs of the merging unit to a connected primary protection relay (e.g., with user-selectable, physical, dual in-line package (DIP) style switches). As depicted, for a merging unit with multiple inputs and outputs (e.g., three phase inputs and three phase outputs), the output selection switches 536 may include three banks 710, 720, 730 to route test input signals to one or more selected tests outputs (e.g., outputs 534, 572, 644 of merging units 330, 372, 672 as shown in FIG. 6).

In this example, switches 712, 716 may be selected to bypass the A-phase and C-phase test signal inputs from their normal destination of the protection relay to an output in communication with another merging unit while the remaining switches 714, 722, 724, 726, 732, 734, 736 direct the signals in a usual manner to the protection relay. As shown, the output may be user-selectable in order to direct signals to a downstream merging unit.

Figure 8:
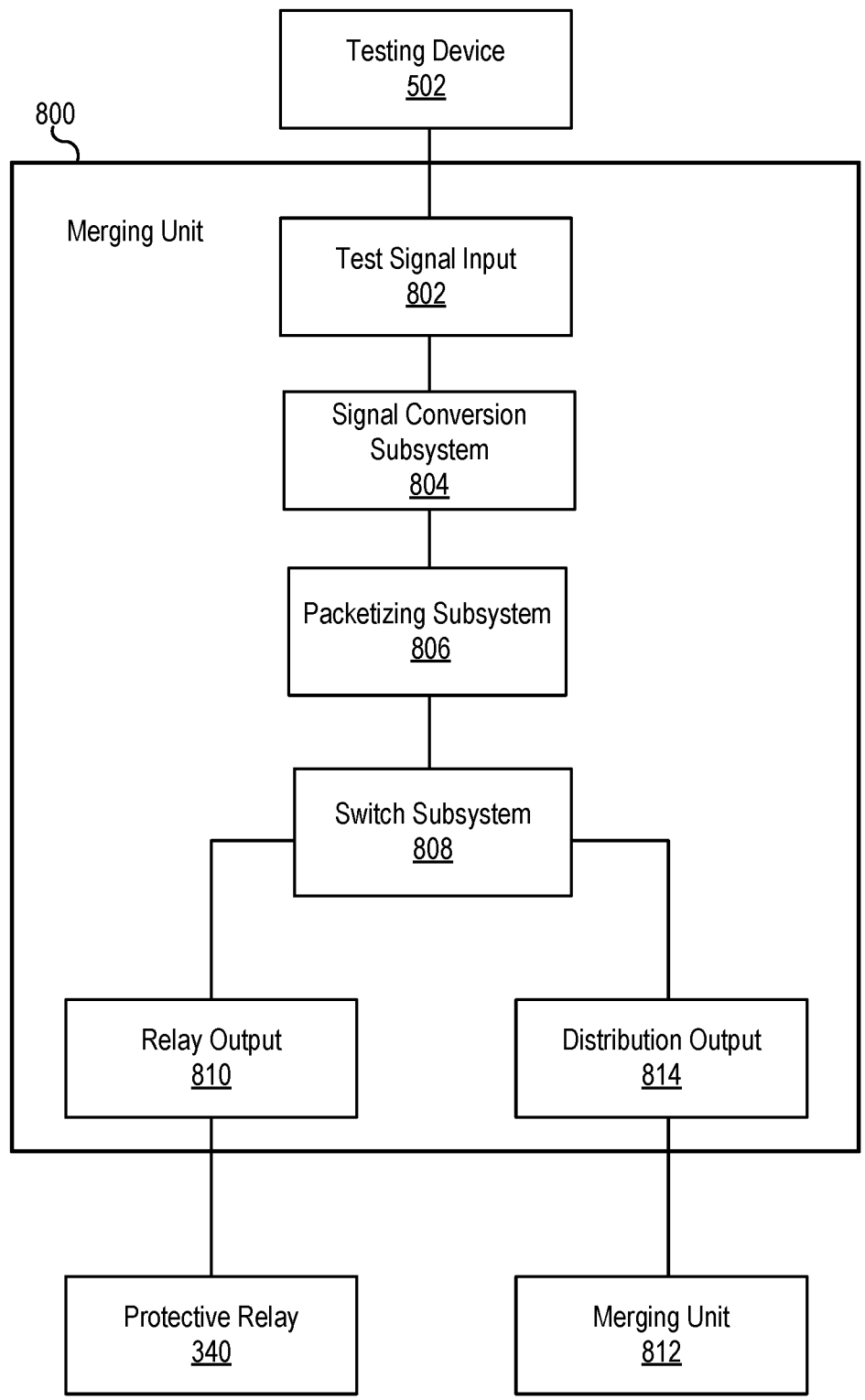
FIG. 8 illustrates a simplified block diagram of a system for testing a protection relay in accordance with embodiments of the disclosure.

FIG. 8 illustrates a simplified block diagram of a system for testing a primary protection relay 340 with a merging unit 800. As depicted, a testing device 502 provides test signals to a test signal input 802 of the merging unit 800. The signal conversion subsystem 804 (e.g., an A/D converter) converts the test signals from the testing device 502 from analog signals to digital signals. A packetizing subsystem 806 may group at least some of the test signals after being converted by the signal conversion subsystem 804.

A switch system 808 including one or more physical and/or logical switches may direct the test signals either to the protection relay 340 via the relay output 810 and/or to another merging unit 812 via distribution output 814.

Figure 9:
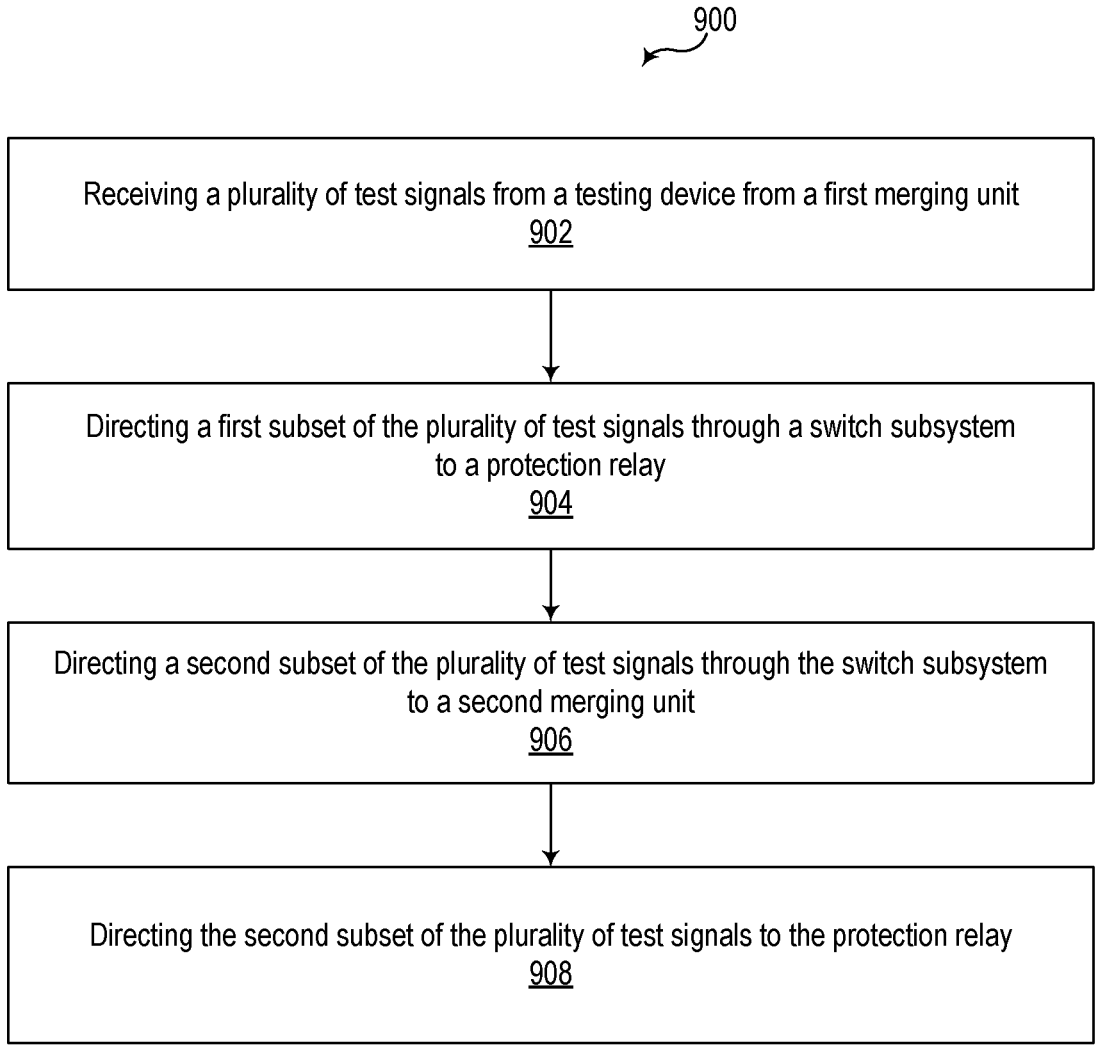
FIG. 9 illustrates a flow chart of a method of testing a protection relay of an electric power delivery system in accordance with embodiments of the disclosure.

FIG. 9 illustrates a flow chart of a method 900 of testing a protection relay of an electric power delivery system.

At 902, a plurality of test signals test signals are received with a first merging unit from a testing device.

At 904, a first subset of the plurality of test signals is directed through a switch subsystem of the first merging unit to a protection relay.

At 906, a second subset of the plurality of test signals is directed through the switch subsystem a second merging unit.

At 908, the second subset of the plurality of test signals is directed through the second merging unit to the protection relay.

While specific embodiments and applications of the disclosure have been illustrated and described, it is to be understood that the disclosure is not limited to the precise configurations and components disclosed herein. Accordingly, many changes may be made to the details of the above-described embodiments without departing from the underlying principles of this disclosure. The scope of the present invention should, therefore, be determined only by the following claims.

What is claimed is:

1. A system to test a protection relay for use in an electric power system, comprising:
   a first merging unit to receive electric power system signals from an electric power delivery system, the first merging unit comprising:
      a test signal input to receive a plurality of test signals;
      a protection relay output to communicate a first subset of the plurality of test signals to the protection relay;
      a distribution output to communicate a second subset of the plurality of test signals; and
      a switch subsystem to selectively route the test signals to the relay output or the distribution output; and
   a second merging unit in communication with the first merging unit via the distribution output to receive the second subset of the plurality of test signals.

2. The system of claim 1, further comprising a testing device to generate the plurality of test signals comprising at least one of a current or a voltage.

3. The system of claim 2, wherein the testing device comprises a plurality of phase outputs to transmit phase test signals to the first merging unit, the phase test signals comprising a plurality of alternating current signals of differing phase.

4. The system of claim 1, wherein the system is to redirect the first subset of the plurality of test signals to the second merging unit using the switch subsystem and to redirect the second subset of the plurality of test signals to the protection relay using the switch subsystem.

5. The system of claim 1, wherein the plurality of test signals comprise at least one of a current signal or a voltage signal in a first phase to the protection relay.

6. The system of claim 1, wherein communications between the testing unit and the second merging unit pass through the first merging unit via an existing communication link between the first merging unit and the second merging unit.

7. The system of claim 1, wherein the first merging unit further comprises a signal conversion subsystem comprising one or more analog-to-digital (A/D) converters to convert the test signals from the testing device from an analog signal to a digital signal.

8. A system to test a protection relay for use in an electric power system, comprising:
   a first merging unit to receive electric power system signals from an electric power delivery system, the first merging unit comprising:
      a test signal input to receive a plurality of test signals;
      a protection relay output to communicate a first subset of the plurality of test signals to the protection relay;
      a distribution output to communicate a second subset of the plurality of test signals; and
      a switch subsystem to selectively route the test signals to the relay output or the distribution output;
      a signal conversion subsystem comprising one or more analog-to-digital (A/D) converters to convert the test signals from the testing device from an analog signal to a digital signal; and
      a packetizing subsystem to group at least some of the test signals after being converted by the signal conversion subsystem.

9. The system of claim 8, the first merging unit further to send the grouped test signals to one of the protection relay output or the distribution output.

10. The system of claim 1, wherein the test signal input comprises two or more inputs, and wherein the switch subsystem comprises a logical switch to selectively direct each of the two or more inputs.

11. A system to test a protection relay, comprising:
a test device comprising phase outputs to transmit a plurality of phase test signals;
a first merging unit in communication with the test device, the first merging unit comprising:
a first test signal input to receive the plurality of phase test signals;
a first protection relay output to communicate a first subset of the phase test signals to the protection relay; and
a first distribution output to communicate a second subset of the plurality of phase test signals;
a second merging unit in communication with the first distribution output of the first merging unit, the second merging unit comprising:
a second test signal input to receive the second subset of the plurality of phase test signals from the first distribution output of the first merging unit; and
a second protection relay output to communicate the second subset of the plurality of phase test signals to the power protection relay.

12. The system of claim 11, wherein the first merging unit further comprises an interface to selective direct the phase test signals to one of the power protection relay or the second merging unit.

13. The system of claim 12, wherein the interface comprises multiple switches, each in communication with a respective one of the phase outputs.

14. The system of claim 11, wherein communications between the testing unit and the second merging unit pass through the first merging unit via an existing communication link between the first merging unit and the second merging unit.

15. The system of claim 11, further comprising a test controller to control the test device.

16. A method of testing a protection relay of an electric power delivery system, the method comprising:
receiving a plurality of test signals with a first merging unit from a testing device;
directing a first subset of the plurality of test signals through a switch subsystem of the first merging unit to the protection relay;
directing a second subset of the plurality of test signals through the switch subsystem of the first merging unit to a second merging unit;
directing the second subset of the plurality of test signals through the second merging unit to the protection relay;
converting the test signals from analog signals to digital signals with one or more analog-to-digital converters of the first merging unit; and
bypassing an analog-to-digital converter in the second merging unit when supplying at least some of the test signals from the first merging unit.

17. The method of claim 16, further comprising:
redirecting the first subset of the plurality of test signals to the second merging unit using an interface; and
redirecting the second subset of the plurality of test signals to the protection relay using the interface.

18. The method of claim 16, further comprising directing a third subset of the plurality of test signals to a third merging unit.

19. The method of claim 18, further comprising sending the third subset of the plurality of test signals from a distribution output of the second merging unit.

20. The method of claim 18, further comprising packetizing the test signals after converting the plurality of test signals from the analog signals to the digital signals.

* * * * *